United States Patent
Kershaw et al.

(10) Patent No.: US 10,241,167 B2
(45) Date of Patent: Mar. 26, 2019

(54) TENSIONING APPARATUS, SUPERCONDUCTING MAGNET AND MAGNETIC RESONANCE IMAGING APPARATUS

(71) Applicant: Siemens Shenzhen Magnetic Resonance Ltd., Shenzhen (CN)

(72) Inventors: Edward Wedderburn Kershaw, Oxon (GB); Nicholas Mann, Compton (GB); Bu Qing Zhang, Shenzhen (CN); Shao Kun Zhao, Guangdong (CN)

(73) Assignee: Siemens Healthcare Limited, Camberley (GB)

( * ) Notice: Subject to any disclaimer, the term of this patent is extended or adjusted under 35 U.S.C. 154(b) by 344 days.

(21) Appl. No.: 15/018,023

(22) Filed: Feb. 8, 2016

(65) Prior Publication Data
US 2016/0231398 A1 Aug. 11, 2016

(30) Foreign Application Priority Data
Feb. 9, 2015 (CN) .......................... 2015 1 0068386

(51) Int. Cl.
*G01R 33/38* (2006.01)
*G01R 33/3815* (2006.01)

(52) U.S. Cl.
CPC ..... *G01R 33/3802* (2013.01); *G01R 33/3815* (2013.01)

(58) Field of Classification Search
CPC .......................... G01R 33/3802; G01R 33/3815
USPC ........................................................ 324/318
See application file for complete search history.

(56) References Cited

U.S. PATENT DOCUMENTS

| 4,325,530 A * | 4/1982 | Niemann | F17C 13/087 248/317 |
| 4,516,405 A * | 5/1985 | Laskaris | F17C 3/085 138/112 |
| 5,083,105 A | 1/1992 | Herd et al. | |
| 6,595,634 B1 * | 7/2003 | Pilat, Jr. | G02C 1/04 351/103 |
| 7,665,313 B2 | 2/2010 | Dixey et al. | |
| 8,141,840 B2 * | 3/2012 | Mann | F17C 13/083 248/317 |
| 2004/0008318 A1 * | 1/2004 | Pilat, Jr. | G02C 1/04 351/86 |
| 2005/0254000 A1 * | 11/2005 | Lerner | G02C 1/02 351/100 |

FOREIGN PATENT DOCUMENTS

BE 1004934 A7 3/1993
GB 2503448 A 1/2014

* cited by examiner

*Primary Examiner* — Susan S Lee
(74) *Attorney, Agent, or Firm* — Schiff Hardin LLP (57) ABSTRACT

A tensioning apparatus for supporting a low-temperature apparatus in a vacuum vessel of a superconducting magnet of a magnetic resonance imaging apparatus, has a main body that has a fixed end for fixing the main body, and a free end, a locating piece, situated between the fixed end and the free end; and an adjusting piece having a supporting part, supported between the free end and the locating piece, and an operating part, connected to the supporting part, and operable for adjusting the length of the supporting part in the direction of extension of the main body and thereby tensioning the main body.

8 Claims, 12 Drawing Sheets

TENSIONING APPARATUS, SUPERCONDUCTING MAGNET AND MAGNETIC RESONANCE IMAGING APPARATUS

BACKGROUND OF THE INVENTION

Field of the Invention

The present invention relates to the technical field of magnetic resonance imaging, in particular a tensioning apparatus, a superconducting magnet and a magnetic resonance imaging apparatus.

Description of the Prior Art

In the prior art, a cooling vessel for a superconducting magnet used in a magnetic resonance imaging (MRI) scanner has the basic components of a superconducting magnet, a low-temperature holding apparatus, an outer vacuum vessel surrounding the low-temperature holding apparatus, a load-bearing support, and suspending elements. The superconducting magnet is disposed in the low-temperature holding apparatus, for the purpose of subjecting the superconducting magnet to low-temperature cooling by the low-temperature holding apparatus. The load-bearing support is used for supporting the superconducting magnet with the low-temperature holding apparatus suspended in the outer vacuum vessel by the suspending elements. Since a preload must be applied to the suspending elements, in order to ensure that all elements remain tensioned during an impact load and to ensure the vessel remains accurately aligned, threaded connecting pieces in the suspending elements, which are fastened during an assembly process step, are generally used to achieve the required preloading.

The torque needed to fasten the threaded pieces may be very large, and in certain applications, will exceed the capability of manual tools in the available space. Moreover, since the load-bearing support supports the superconducting magnet, the load-bearing support inevitably occupies the same space as the suspending elements. Thus, with an ever greater need for cooling vessels to satisfy demands for minimization of dimensions, the complicated nature of existing cooling vessel suspending elements and the assembly process steps thereof have led to an increase in manufacturing costs.

SUMMARY OF THE INVENTION

In view of the above, the present invention concerns a tensioning apparatus, a superconducting magnet and a magnetic resonance imaging apparatus that effectively save manufacturing costs, while still maintaining tension effectively during MRI operation or in the case of a low-temperature holding apparatus load impact caused by the superconducting magnet during movement of the low-temperature holding apparatus.

The present invention provides a tensioning apparatus that has a main body, which has a fixed end for fixing the main body, and a free end. The tensioning apparatus also has a locating piece, situated between the fixed end and the free end. The tensioning apparatus also has an adjusting piece that has a supporting part, supported between the free end and the locating piece, and an operating part, connected to the supporting part, which is operable to adjust the length of the supporting part in the direction of extension of the main body, to thereby tensioning the main body.

The present invention also provides a superconducting magnet having a low-temperature apparatus, a vessel and at least one tensioning apparatus as described above, wherein the low-temperature apparatus is situated inside the vessel, the fixed end is connected to the low-temperature apparatus in a fixed but detachable manner, the locating piece is connected to the vessel in a fixed but detachable manner, and the vessel has one or more through-holes through which the main body passes.

The present invention also provides a magnetic resonance imaging apparatus embodying the superconducting magnet as described above.

In the tensioning apparatus, superconducting magnet and magnetic resonance imaging apparatus of the present invention, the tensioning apparatus has a main body, a locating piece and an adjusting piece. The main body has a fixed end and a free end. The adjusting piece has a supporting part and an operating part. Specifically, the fixed end is used for fixing the main body; the locating piece is situated between the fixed end and the free end. The supporting part is supported between the free end and the locating piece. Since the operating part is connected to the supporting part, and used for adjusting the length of the supporting part in the direction of extension of the main body and thereby tensioning the main body, it is ensured that tension is maintained during MRI operation or in the case of a low-temperature apparatus load impact caused by the superconducting magnet during movement of the low-temperature apparatus. Moreover, compared with suspending elements in the prior art, since the tensioning apparatus of the present invention is formed of the main body, locating piece and adjusting piece, i.e. is a dismantlable apparatus, it saves space effectively, makes the manufacturing process relatively easy, and has a low cost.

DESCRIPTION OF THE PREFERRED EMBODIMENTS

The object, technical solution and advantages of the present invention are explained in further detail below by a number of embodiments.

Embodiment One

Figure 1:
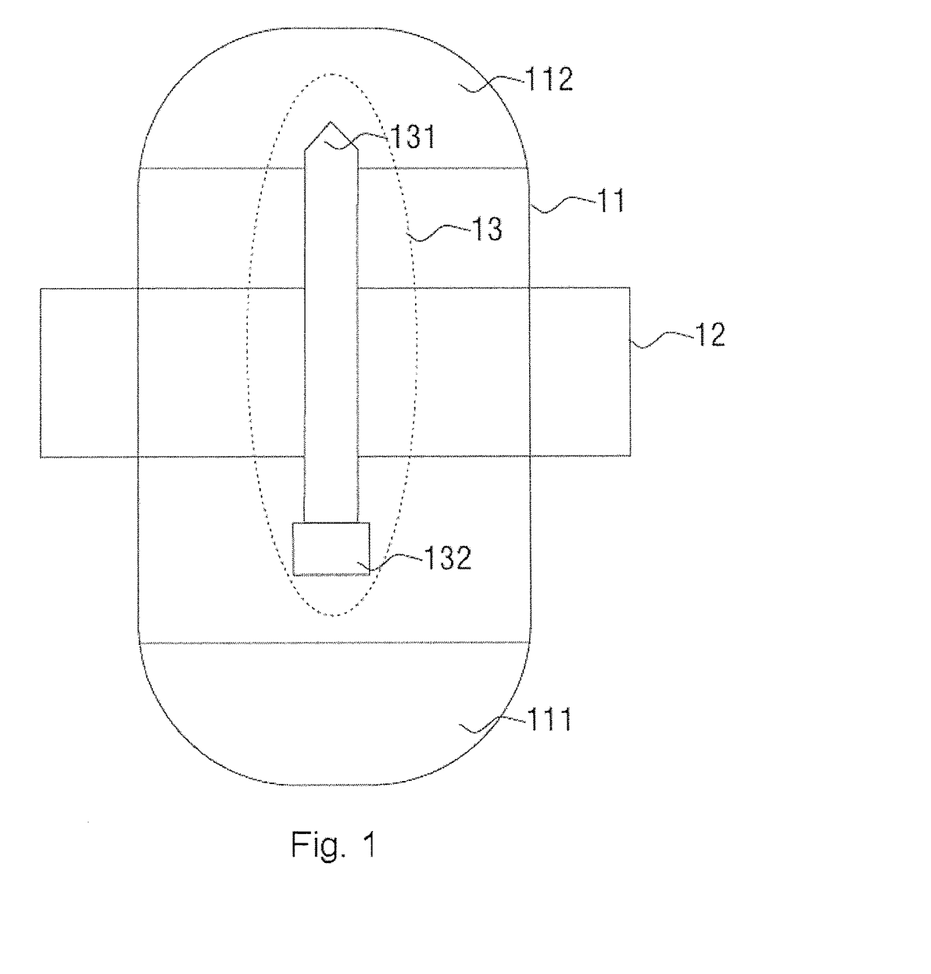
FIG. 1 is a structural schematic illustration of a first embodiment of the tensioning apparatus of the present invention.

FIG. 1 is a structural schematic illustration of a first embodiment of the tensioning apparatus of the present invention. As FIG. 1 shows, the tensioning apparatus has a main body 11, a locating piece 12 and an adjusting piece 13. The main body 11 has a fixed end 111 and a free end 112. The adjusting piece 13 has a supporting part 131 and an operating part 132. The fixed end 111 is used for fixing the main body 11. The locating piece 12 is situated between the fixed end 111 and the free end 112. The supporting part 131 is supported between the free end 112 and the locating piece 12. The operating part 132 is connected to the supporting part 131, and is operable to adjust the length of the supporting part 131 in the direction of extension of the main body 11, thereby tensioning the main body 11.

In this embodiment, the tensioning apparatus may be used with a superconducting magnet. Such a superconducting magnet may have a low-temperature apparatus and vessel, with the low-temperature apparatus being inside the vessel. The fixed end 111 of the tensioning apparatus is connected in a fixed manner to the low-temperature apparatus, and the locating piece 12 is connected in a fixed manner to the vessel. Preferably, the fixed connection between the locating piece 12 and the vessel is accomplished by screws, rivets, or welding, etc.

In this embodiment, the tensioning apparatus has a main body, a locating piece and an adjusting piece. The main body comprises a fixed end and a free end. The adjusting piece comprises a supporting part and an operating part. The fixed end is used for fixing the main body, and the locating piece is situated between the fixed end and the free end. The supporting part is supported between the free end and the locating piece. Since the operating part is connected to the supporting part, and is used for adjusting the length of the supporting part in the direction of extension of the main body and thereby tensioning the main body, it is ensured that tension is maintained during MRI operation or in the case of a low-temperature apparatus load impact caused by the superconducting magnet during movement of the low-temperature apparatus. Moreover, compared with suspending elements in the prior art, since the tensioning apparatus of the present invention is formed mainly of the main body, locating piece and adjusting piece, i.e. is a dismantlable apparatus, it saves space effectively, the manufacturing process is relatively easy and has a low cost.

Embodiment Two

Figure 2:
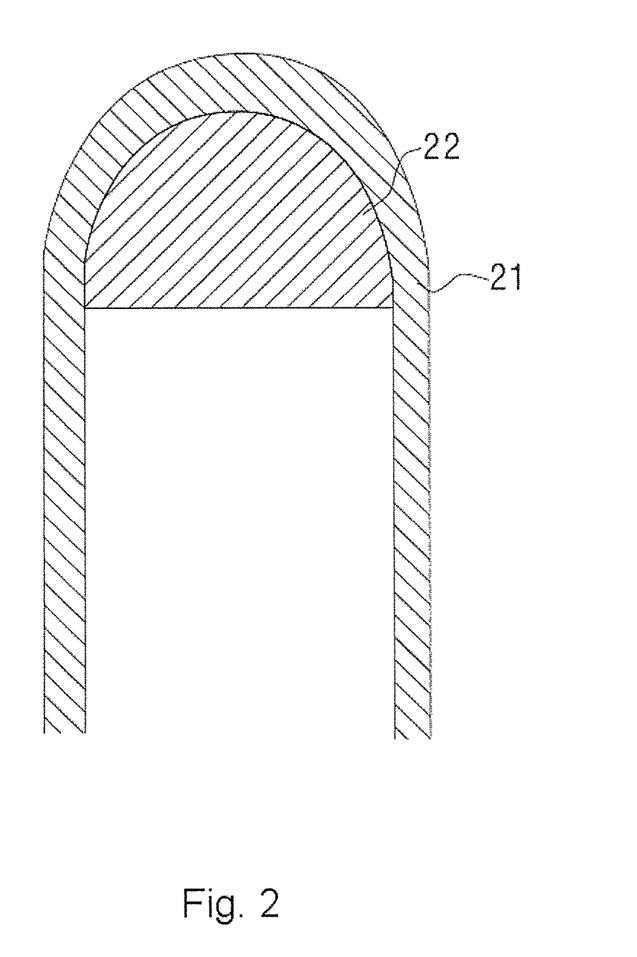
FIG. 2 is a local structural schematic illustration of a second embodiment of the free end in the tensioning apparatus of the present invention.

FIG. 2 is a local structural schematic illustration of a second embodiment of the free end in the tensioning apparatus of the present invention. Building upon embodiment one shown in FIG. 1 and described above, as FIG. 2 shows, the free end 112 has a load-bearing part 21 and a connecting part 22. Two ends of the connecting part 22 are connected to the supporting part 131 and the load-bearing part 21, respectively.

In this embodiment, the load-bearing part 21 is high-strength carbon fiber reinforced composite material (carbon fiber reinforced polymer/plastic; abbreviated as CFRP) or glass-reinforced thermosetting plastic or fiberglass (glass-reinforced plastic; abbreviated as GRP).

Furthermore, optionally, the load-bearing part 21 is arc-shaped, the connecting part 22 is fan-shaped, and the load-bearing part 21 matches the connecting part 22.

Alternatively, the connecting part 22 has a groove 221 that matches the load-bearing part 21.

Figure 3:
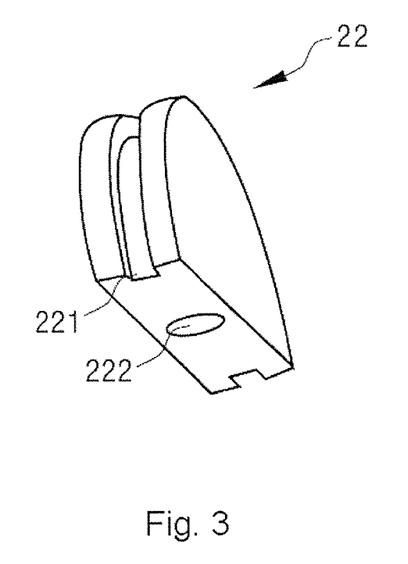
FIG. 3 is a structural schematic illustration of the connecting part in the second embodiment of the tensioning apparatus of the present invention.

In this embodiment, as an example, FIG. 3 is a structural schematic illustration of the connecting part in the second embodiment of the tensioning apparatus of the present invention. As FIG. 3 shows, the connecting part 22, besides having a groove 221, also has a blind hole 222, allowing the supporting part 22 to be rotatably inserted in the blind hole 222, so as to enable adjustment of the distance between the connecting part 22 and the locating piece 12, in order to furthermore facilitate pretensioning of the load-bearing part 21.

Furthermore, in this embodiment, since the groove matches the load-bearing part, the area of contact between the connecting part and the load-bearing part is effectively increased, thereby effectively increasing the structural strength and stability.

Embodiment Three

Figure 4:
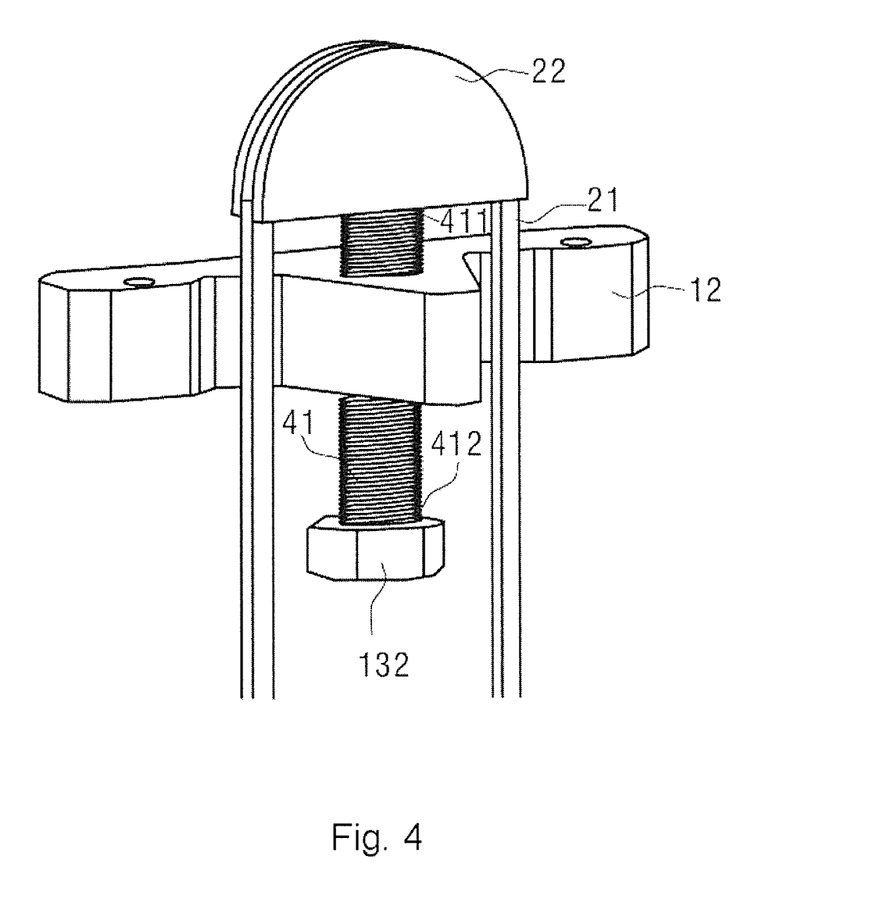
FIG. 4 is a structural schematic illustration of a third embodiment of the tensioning apparatus of the present invention.

FIG. 4 is a structural schematic diagram of a third embodiment of the tensioning apparatus of the present invention. Building upon the embodiment shown in FIG. 1 or 2 and described above, as FIG. 4 shows, the supporting part 131 has a first bolt 41, the first bolt 41 having a first end 411 and a second end 412; the first end 411 abuts the free end 112 rotatably.

Furthermore, optionally, the locating piece 12 has a through-hole 121, and the first bolt 41 passes through the locating piece 12 via the through-hole 121. The operating part 132 is a nut connected to the second end 412.

Figure 5:
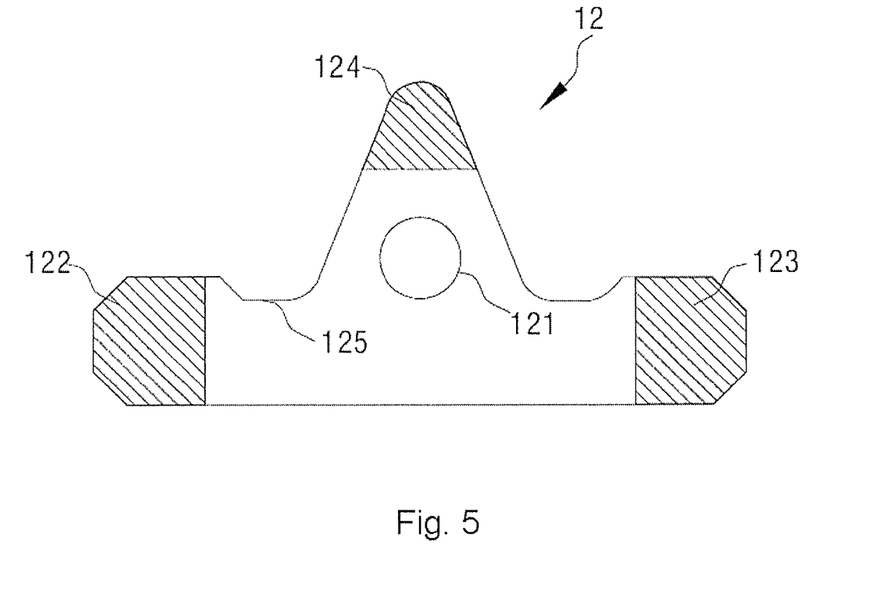
FIG. 5 is a structural schematic illustration of a locating piece in the third embodiment of the tensioning apparatus of the present invention.

Optionally, FIG. 5 is a structural schematic illustration of a locating piece in the third embodiment of the tensioning apparatus of the present invention. As FIG. 5 shows, the locating piece 12 may also comprise: a first support point 122, a second support point 123 and a third support point 124; wherein the first support point 122, second support point 123 and third support point 124 are separately fixed to a surface of the vessel.

It should be noted that in this embodiment, the combination of the locating piece 12 having a through-hole 121, a first support point 122, a second support point 123 and a third support point 124 is only an example. Optionally, the locating piece 12 may also have only a through-hole 121, a first support point 122 and a second support point 123, i.e. does not comprise a third support point 124.

Optionally, the locating piece 12 also has accommodating openings 125, disposed at the first support point 122 and the second support point 123 in positions corresponding to the load-bearing part 21, for accommodating the load-bearing part 21. Since the load-bearing part 21 is made of CFRP or GRP, i.e. is relatively fragile in a side edge direction, the problem of damage to the load-bearing part 21 caused by the locating piece 12 touching the load-bearing part 21 is avoided effectively by designing the accommodating opening 125 to be concave.

In this embodiment, the through-hole 121 has a first thread matching the first bolt 41, so that the first bolt 41 can be driven to engage with the thread in the through-hole 121 by twisting the nut, and thereby pass through the locating piece 12, such that the first end 412 abuts the free end 112 rotatably, to achieve pretensioning of the load-bearing part 21. Since the through-hole 121 has a thread, it can have a locking effect on the first bolt 41.

Figure 6A:
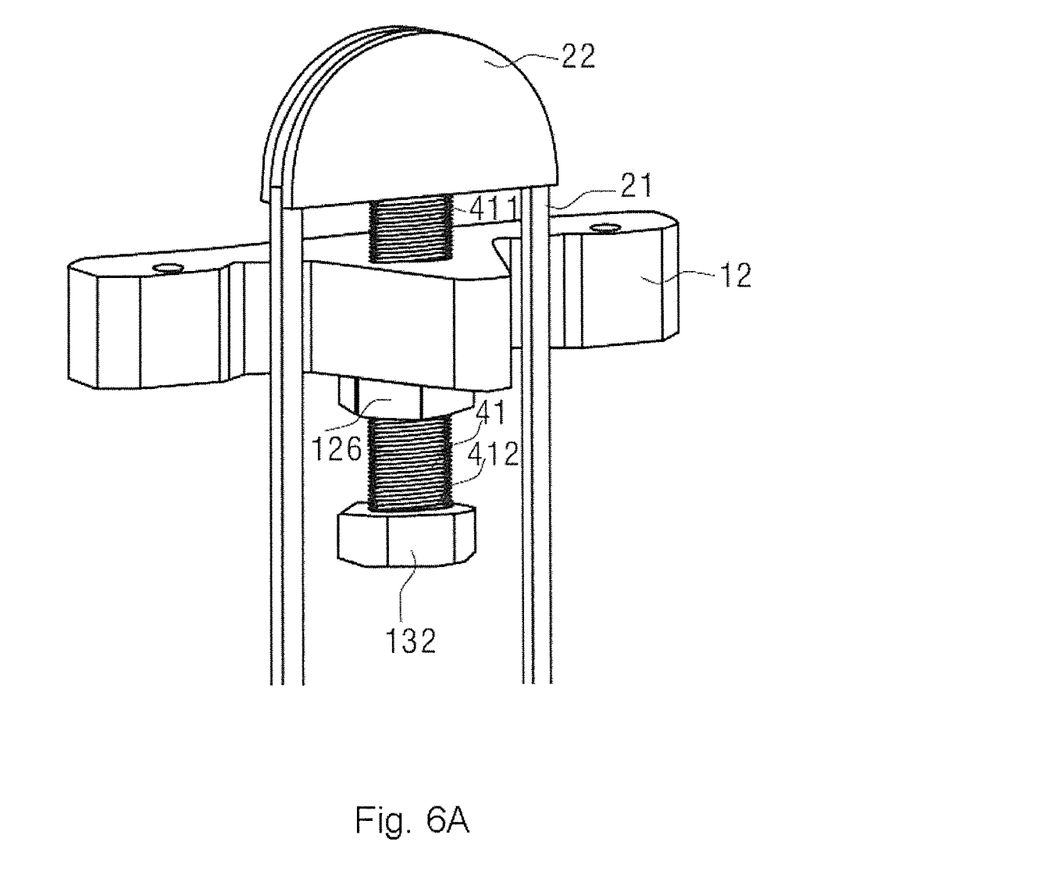
FIG. 6A is another structural schematic illustration of the third embodiment of the tensioning apparatus of the present invention.
Figure 6B:
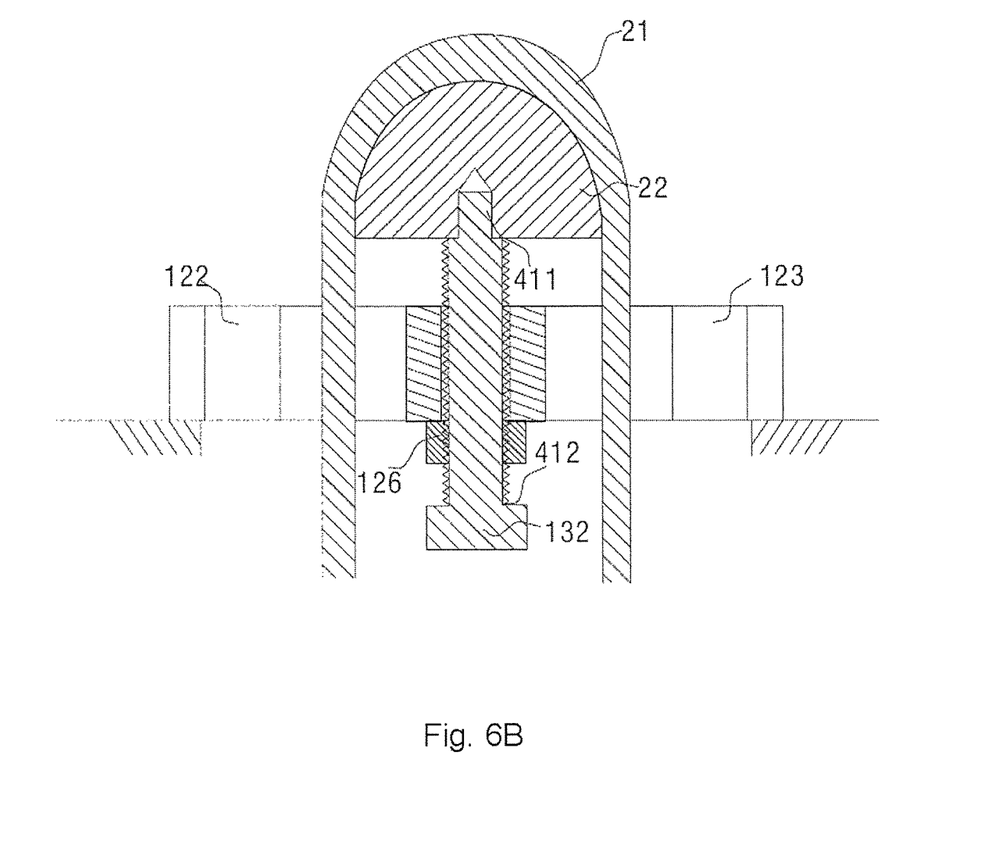
FIG. 6B is a sectional view of FIG. 6A.

Furthermore, in order to enable a further locking effect on the first bolt 41, FIG. 6A is another structural schematic diagram of embodiment three of the tensioning apparatus of the present invention, and FIG. 6B is a sectional view of FIG. 6A. As shown in FIGS. 6A and 6B, the locating piece 12 may also have a nut 126, the nut 126 matching the first bolt 41 and abutting a bottom surface of the locating piece 12.

Embodiment Four

Figure 7A:
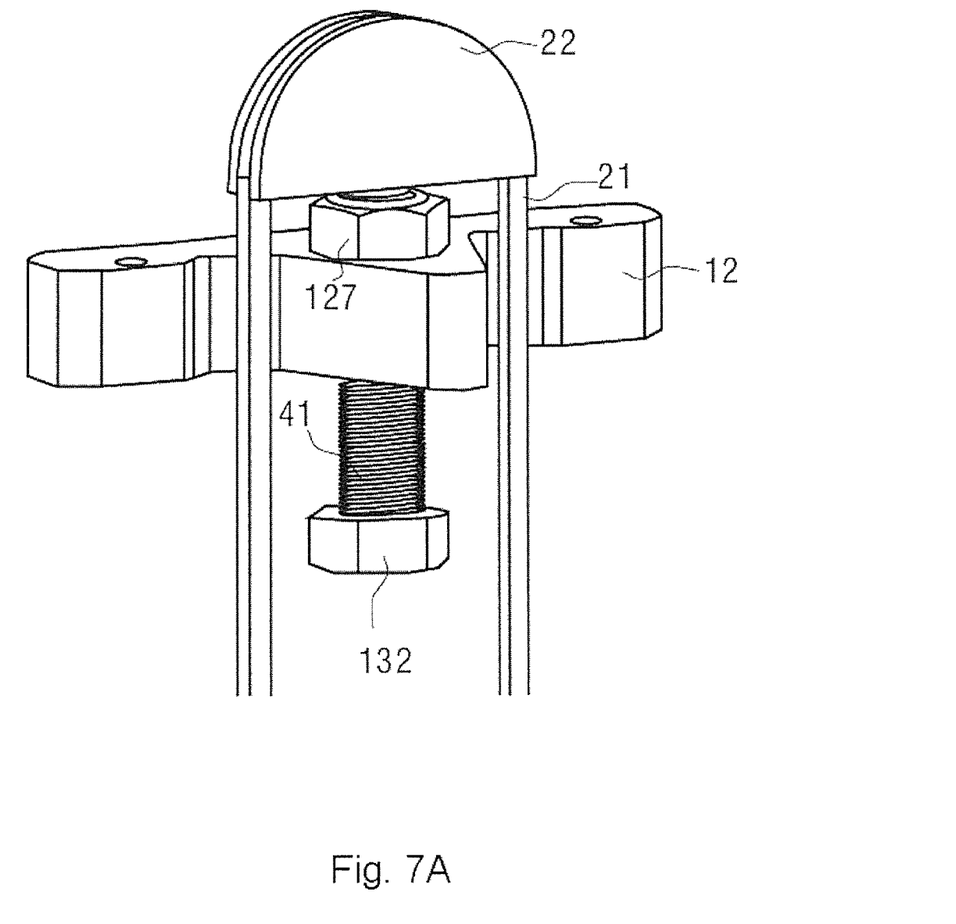
FIGS. 7A and 7B are structural schematic illustrations of a fourth embodiment of the tensioning apparatus of the present invention.
Figure 7B:
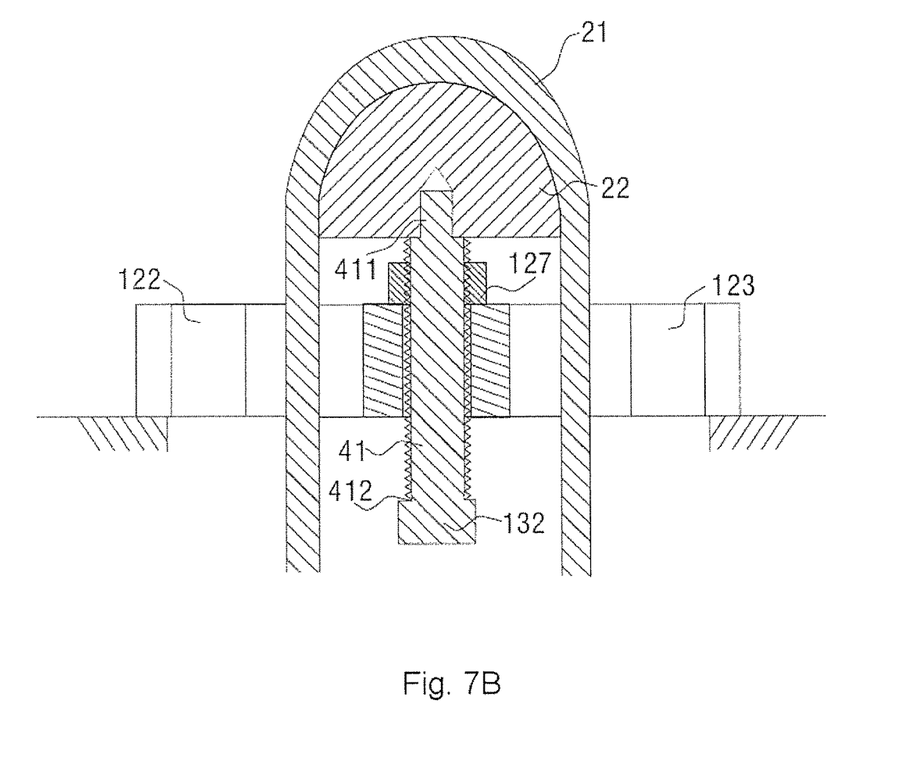

FIG. 7A is a structural schematic illustration of a fourth embodiment of the tensioning apparatus of the present invention; FIG. 7B is a sectional view of FIG. 7A. Building upon the embodiment shown in FIG. 1 or 2 and described above, as FIGS. 7A and 7B show, the supporting part 131 has a first bolt 41, the first bolt 41 comprising a first end 411 and a second end 412; the first end 411 abuts the free end 112 rotatably.

Furthermore, optionally, the locating piece 12 is substantially the same as the locating piece shown in FIG. 5, the difference being that the through-hole 121 does not have a thread, i.e. the through-hole 121 is a smooth through-hole. Moreover, the locating piece 12 also has a nut 127, the nut 127 matching the first bolt 41 and abutting a bottom surface of the locating piece 12.

Specifically, the first bolt 41 is driven to pass through the through-hole 121 and engage with the thread in the nut 127 by twisting the nut, and thereby passes through the locating piece 12, such that the first end 411 abuts the free end 112 rotatably, to achieve pretensioning of the load-bearing part 21. The nut 127 can have a locking effect on the first bolt 41.

Optionally, when pretensioning is complete, threadlocker may be spread between the nut 127 and the first bolt 41 to perform further locking. Alternatively, another nut is provided on the first bolt 41 between the nut 127 and the connecting part 22, so that a supporting pin is screwed tight by the additional nut, so as to achieve a locking effect.

Embodiment Five

Figure 8:
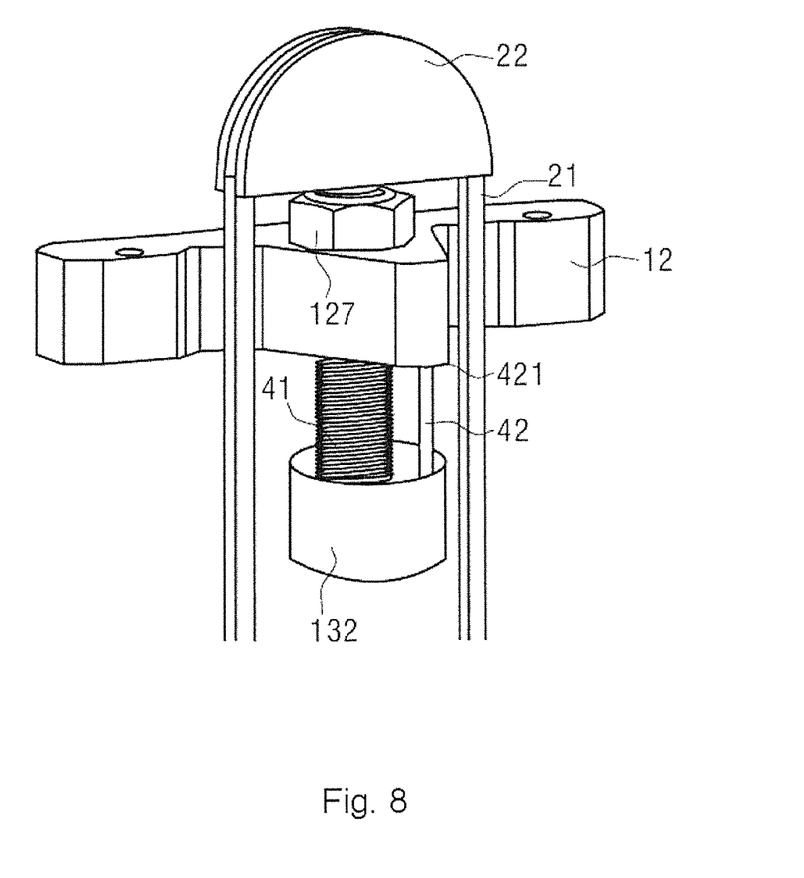
FIG. 8 is a structural schematic illustration of a fifth embodiment of the tensioning apparatus of the present invention.

FIG. 8 is a structural schematic illustration of a firth embodiment of the tensioning apparatus of the present invention. Building upon the embodiment shown in FIG. 1 or 2 and described above, as FIG. 8 shows, the supporting part 131 comprises a first bolt 41, the first bolt 41 comprising a first end 411 and a second end 412; the first end 411 abuts the free end 112 rotatably.

Optionally, the operating part 132 is a sleeve, an inner wall of the sleeve having a second thread, the second thread matching the first bolt 41.

Furthermore, the supporting part 131 also has a connecting rod 42, the connecting rod 42 comprising a third end 421 and a fourth end 422; the second end 412 and the third end 421 are disposed facing each other in the sleeve, and the fourth end 422 abuts the locating piece 12 rotatably.

It should be noted that a thread may or may not be provided on the connecting rod 42. Thus by twisting the sleeve to drive the connecting rod 42 and the first bolt 41 to rotate, tensioning of the main body 21 is achieved, and detachment of the first bolt 41 can be prevented effectively.

Moreover, the connecting rod 42 may be a second bolt matching the second thread. Thus the length of those parts of the second bolt and first bolt which are located outside the sleeve can be increased by rotating the sleeve, i.e. the length of the supporting part is increased, so as to tension the main body.

Embodiment Six

Figure 9A:
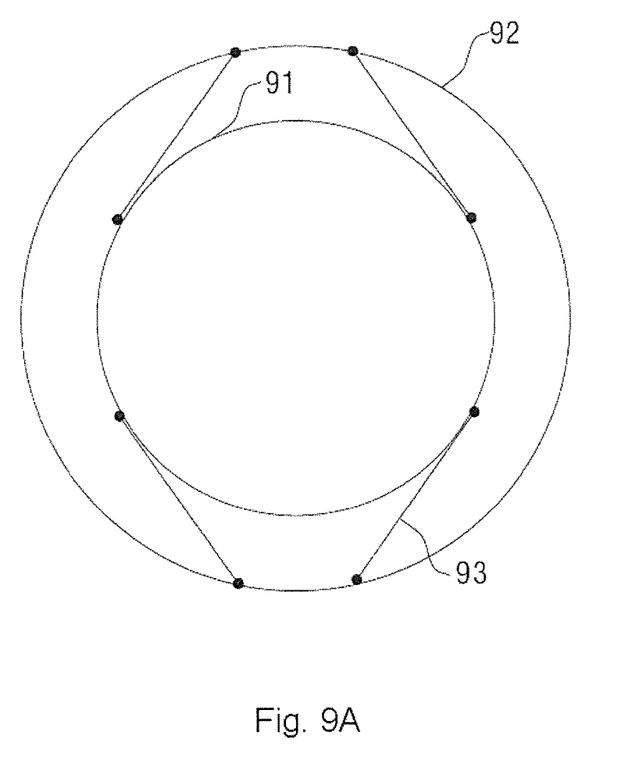
FIG. 9A is an axial structural schematic illustrates of a sixth embodiment of the superconducting magnet of the present invention.
Figure 9B:
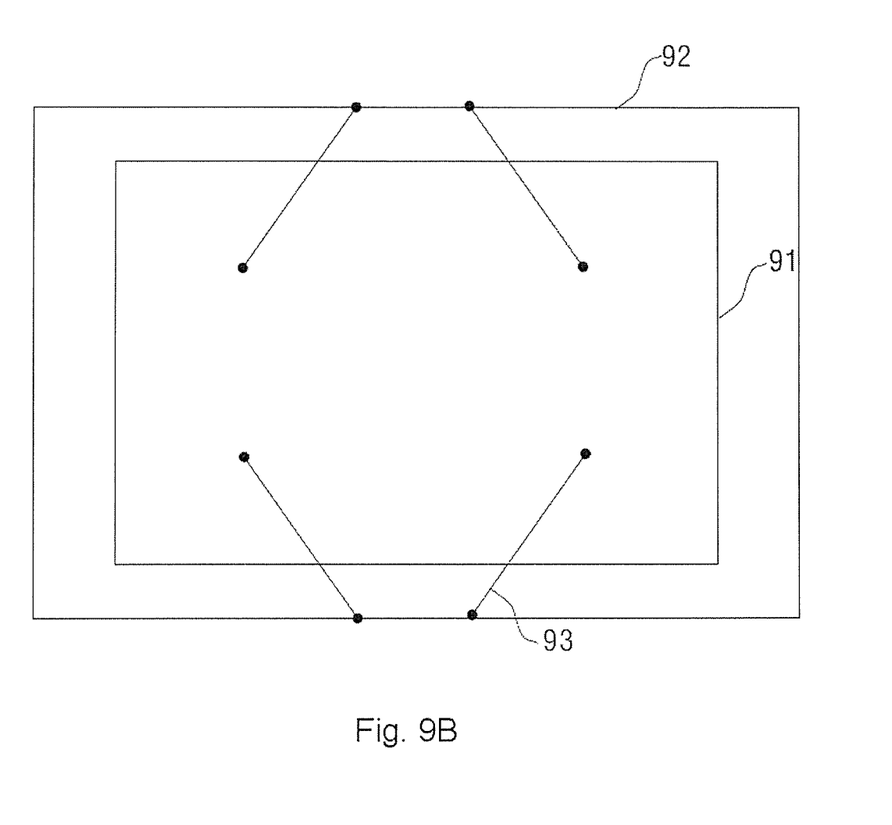
FIG. 9B is a radial structural schematic illustrates of the sixth embodiment of the superconducting magnet of the present invention.

FIG. 9A is an axial structural schematic illustration of a sixth embodiment of the superconducting magnet of the present invention, while FIG. 9B is a radial structural schematic diagram of the sixth embodiment of the superconducting magnet of the present invention. As FIGS. 9A and 9B show, the superconducting magnet has a low-temperature apparatus 91, a vessel 92 and a tensioning apparatus 93; wherein the low-temperature apparatus 91 is located inside the vessel 92, and the tensioning apparatus 93 may be the tensioning apparatus as shown in any one of embodiments one to five above, with similar implementation principles and effects, which are not repeated here. Specifically, the fixed end of the tensioning apparatus 93 is connected in a fixed manner to the low-temperature apparatus 91, the locating piece is connected in a fixed manner to the vessel 92, and the vessel has one or more through-holes through which the main body passes.

Embodiment Seven

The present invention also provides a magnetic resonance imaging apparatus having the superconducting magnet as shown in the sixth embodiment above, with similar implementation principles and effects, which are not repeated here.

Although modifications and changes may be suggested by those skilled in the art, it is the intention of the inventors to embody within the patent warranted hereon all changes and modifications as reasonably and properly come within the scope of their contribution to the art.

We claim as our invention:

1. A tensioning apparatus, comprising:
a main body, comprising:
a fixed end, for fixing the main body, and
a free end;
a locating piece between the fixed end and the free end of the main body; and
an adjusting piece, comprising:
a supporting part, supported between the free end and the locating piece, said supporting part comprising a bolt, the bolt comprising a first end and a second end, and the first end abutting the free end rotatably, and the locating piece comprising a through-hole, the bolt passing through the locating piece via the through-hole, and an operating part is a nut connected to the second end, and said operating part being, connected to the supporting part, and used for adjusting a length of the supporting part in the direction of extension of the main body and thereby tensioning the main body.

2. The tensioning apparatus as claimed in claim 1, wherein the through-hole comprises a first thread matching the bolt.

3. The tensioning apparatus as claimed in claim 1, wherein the locating piece also comprises a nut matching the bolt.

4. The tensioning apparatus as claimed in claim 2, wherein the operating part is a sleeve, an inner wall of the sleeve comprising a second thread, the second thread matching the bolt.

5. The tensioning apparatus as claimed in claim 4, wherein the supporting part comprises a connecting rod, the connecting rod comprising a third end and a fourth end; the second end and the third end are disposed facing each other in the sleeve, and the fourth end abuts the locating piece rotatably.

6. The tensioning apparatus as claimed in claim 5, wherein said bolt is a bolt, and wherein the connecting rod is a second bolt matching the second thread.

7. A superconducting magnet comprising:
a low-temperature apparatus;
a vacuum vessel in which said low-temperature apparatus is contained; and
a tensioning apparatus comprising a main body comprising a fixed end, for fixing the main body, and a free end, a locating piece between the fixed end and the free end of the main body, and an adjusting piece comprising a supporting part, supported between the free end and the locating piece, and an operating part, connected to the supporting part, and used for adjusting a length of the supporting part in the direction of extension of the main body and thereby tensioning the main body; and
said fixed end of said main body being connected to said low-temperature apparatus with a fixed but detachable connection, said locating piece being connected to said vacuum vessel with a fixed but detachable connection, and said vacuum vessel comprising at least one through-hole through which said main body passes.

8. A magnetic resonance apparatus comprising:
a magnetic resonance data acquisition scanner comprising a superconducting magnet;
said superconducting magnet comprising a low-temperature apparatus and a vacuum vessel in which said low-temperature apparatus is situated;
a tensioning apparatus comprising a main body comprising a fixed end, for fixing the main body, and a free end, a locating piece between the fixed end and the free end of the main body, and an adjusting piece, comprising a supporting part, supported between the free end and the locating piece, and an operating part, connected to the supporting part, and used for adjusting a length of the supporting part in the direction of extension of the main body and thereby tensioning the main body; and
said fixed end of said main body being connected to said low-temperature apparatus with a fixed but detachable connection, said locating piece being connected to said vacuum vessel with a fixed but detachable connection, and said vacuum vessel comprising at least one through-hole through which said main body passes.

* * * * *